United States Patent
Iida et al.

(10) Patent No.: US 8,610,005 B2
(45) Date of Patent: Dec. 17, 2013

(54) SEALING COVER FOR ELECTRIC EQUIPMENT MOUNTED ON CAR

(75) Inventors: Tetsuya Iida, Yokkaichi (JP); Kouji Sakakura, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 312 days.

(21) Appl. No.: 12/912,912

(22) Filed: Oct. 27, 2010

(65) Prior Publication Data

US 2011/0100704 A1    May 5, 2011

(30) Foreign Application Priority Data

Oct. 29, 2009  (JP) ................... 2009-248919

(51) Int. Cl.
*H01R 13/46* (2006.01)
*H01R 13/627* (2006.01)
*H01R 31/08* (2006.01)

(52) U.S. Cl.
USPC ............................ 174/520; 439/364; 439/509

(58) Field of Classification Search
USPC .......... 174/520, 521, 527; 439/149, 362, 364, 439/509, 548, 559, 587, 911, 188, 271, 278, 439/281, 607.55, 607.56, 607.57, 607.58
See application file for complete search history.

(56) References Cited

U.S. PATENT DOCUMENTS

| | | | | |
|---|---|---|---|---|
| 4,684,190 A | * | 8/1987 | Clark et al. | 439/587 |
| 5,201,667 A | * | 4/1993 | Endo et al. | 439/189 |
| 5,551,893 A | * | 9/1996 | Johnson | 439/620.07 |
| 5,820,401 A | * | 10/1998 | Hasz et al. | 439/364 |
| 6,056,592 A | * | 5/2000 | Hashizawa et al. | 439/509 |
| 6,132,230 A | * | 10/2000 | Shinozaki et al. | 439/281 |
| 6,419,510 B2 | * | 7/2002 | Shiraki et al. | 439/188 |
| 6,422,899 B1 | * | 7/2002 | Miyazaki | 439/559 |
| 6,450,823 B1 | * | 9/2002 | Ichio et al. | 439/275 |
| 2004/0214464 A1 | * | 10/2004 | Fukushima et al. | 439/271 |

FOREIGN PATENT DOCUMENTS

JP    2009-117306    5/2009

* cited by examiner

*Primary Examiner* — Chau Nguyen
*Assistant Examiner* — Roshn Varghese
(74) *Attorney, Agent, or Firm* — Gerald E. Hespos; Michael J. Porco; Matthew T. Hespos

(57) ABSTRACT

A sealing cover (10) is provided for closing an opening of an equipment case that accommodates electric equipment of a car. The electric equipment includes a circuit with an operation control portion for switching a main circuit from an operating state to a shutdown state in accordance with signals inputted to an input terminal thereof. The sealing cover (10) has a cover body (11) mounted on the equipment case to close the open part. An interlocking connector (35) is provided on the cover body (11) and is connected to the input terminal when the cover body (11) is mounted on the equipment case and disconnected from the input terminal when the cover body (11) is removed from the equipment case to switch the main body circuit from the operating state to the shutdown state.

15 Claims, 10 Drawing Sheets

SEALING COVER FOR ELECTRIC EQUIPMENT MOUNTED ON CAR

BACKGROUND OF THE INVENTION

1. Field of the Invention

The invention relates to a sealing cover for electric equipment mounted on a car. The sealing cover is mounted removably on an open part formed through an equipment case mounted on the car.

2. Description of the Related Art

Japanese Patent Application Laid-Open No. 2009-117306 discloses a case to accommodate electric equipment of an electric car. An open part is formed through the case so that a connector can be connected to the electric equipment therein. A sealing cover is mounted on the open part so that the open part can be closed. The sealing cover has a cover body made of synthetic resin, a sealing ring mounted on the periphery of the cover body and a locking piece for locking the sealing cover to the open part. The cover body has a covering part that is slightly larger than the open part. A closing part projects from the covering part and has an outer configuration almost same as the outer configuration of the open part. The sealing ring is mounted on a mounting groove formed on the entire peripheral surface of the closing part.

The sealing cover closely contacts the inner peripheral surface of the open part to seal a gap between the open part and the sealing cover and to prevent water or foreign matter from penetrating into the equipment case from the open part. However, the operational portion inside the case may be placed in an energized state when the sealing cover is removed from the open part. Thus it is desirable to take a safety measure.

The invention has been completed in view of the above-described situation. It is an object of the invention to provide a sealing cover for electric equipment on a car that is capable of inputting signals for safety treatment to the electric equipment in a case.

SUMMARY OF THE INVENTION

The invention provides a sealing cover for electric equipment mounted on a car. The sealing cover is mounted removably on an equipment case that accommodates an electric circuit and can close an open part of the equipment case for operational use. The electric circuit has an operation control portion for switching a main body circuit from an operating state to a shutdown state and vice versa in dependence on a situation of signals inputted to an input terminal thereof. The sealing cover has a cover body mounted on the equipment case to close the open part. An interlocking connector is provided on the cover body. The interlocking connector is connected to the input terminal when the cover body is mounted on the equipment case and is disconnected from the input terminal when the cover body is removed from the equipment case to switch the main body circuit from the operating state to the shutdown state.

According to the above-described construction, the interlocking connector and the input terminal provided at the operation control portion of the electric circuit inside the equipment case are placed in a disconnected state simultaneously with the removal of the sealing cover from the open part of the equipment case. Thus the electric circuit of the equipment can be placed securely in the shutdown state. As a result, the equipment inside the equipment case is placed in an unenergized state without fail when the sealing cover is removed from the open part of the equipment case. Therefore, a safety measure is provided for an operator.

The cover body has a sealing ring holding wall disposed along an inner peripheral surface of the open part of the equipment case. A sealing ring is fit on the sealing ring holding wall for sealing a gap between the cover body and the inner peripheral surface of the open part. The sealing ring has an annular sealing part on a peripheral surface side of the sealing ring holding wall. The annular sealing part closely contacts the inner peripheral surface of the open part. A fixing part is continuous with the annular sealing part and contacts the cover body at an inner peripheral surface side of the sealing ring holding wall. The cover body has a holding plate that holds that down the fixing part of the sealing ring to prevent the sealing ring from being removed from the cover body. The interlocking connector is formed integrally with the holding plate part.

According to the above-described construction, the sealing ring can be fixed to the cover body by sandwiching the fixing part of the sealing ring between the cover body and the holding plate. This construction is capable of holding the sealing ring on the cover body at a higher strength than a construction in which the sealing ring is fit on a fixing means, such as a groove, formed on the sealing ring holding wall of the cover body.

The holding plate preferably is mounted on the cover body movably in a direction orthogonal to a direction in which the cover body is mounted on the equipment case. Accordingly, the holding plate is movable relative to the cover body in the direction orthogonal to the direction in which the cover body is mounted on the open part of the equipment case. Therefore it is possible to absorb the geometrical tolerance between the interlocking connector formed integrally with the holding plate and the sealing ring. Accordingly, there is no need to strictly set the geometrical tolerance between the cover body having the sealing ring and the interlocking connector. Consequently it is possible to decrease the generation rate of defective sealing covers and decrease the production cost.

A deviation may be generated between the cover body of the sealing cover for the electric equipment mounted on the car when the interlocking connector and the input terminal inside the equipment case are connected to each other. Thus, a situation may occur where the sealing cover cannot be mounted on the open part because the geometrical tolerance between the input terminal and the open part and the geometrical tolerance between the interlocking connector of the sealing cover and the sealing ring are set widely. Thus, it is necessary to set the geometrical tolerance strictly to mount the sealing cover that has the interlocking connector on the open part of the equipment case after the interlocking connector is connected to the input terminal. However, the invention makes it possible to connect the interlocking connector to the input terminal and to mount the cover body on the open part without generating a deviation therebetween. More particularly, the invention provides an adjusting mechanism between the holding plate and the cover body to allow the cover body to move orthogonal to the direction in which the sealing cover is mounted on the open part of the equipment case after the interlocking connector is connected to the input terminal. Hence, it is possible to mount the sealing ring on the open part without a deviation therebetween, even though a strict geometrical tolerance is not set.

A connection part to be connected to the input terminal of the interlocking connector may have an inclined guide at an inner side of an edge of an opening of the connection part to guide the input terminal into the connection part. Accordingly, the interlocking connector and the input terminal can be connected easily to each other.

The cover body may have a to-be-positioned portion that fits a positioning portion formed on a periphery of the open part to position the cover body relative to the equipment case. Accordingly, the to-be-positioned portion can be fit on the positioning portion to roughly position the sealing ring while mounting the sealing ring on the open part of the equipment case. Thus this construction facilitates a mounting operation.

DETAILED DESCRIPTION OF THE PREFERRED EMBODIMENTS

Figure 1:
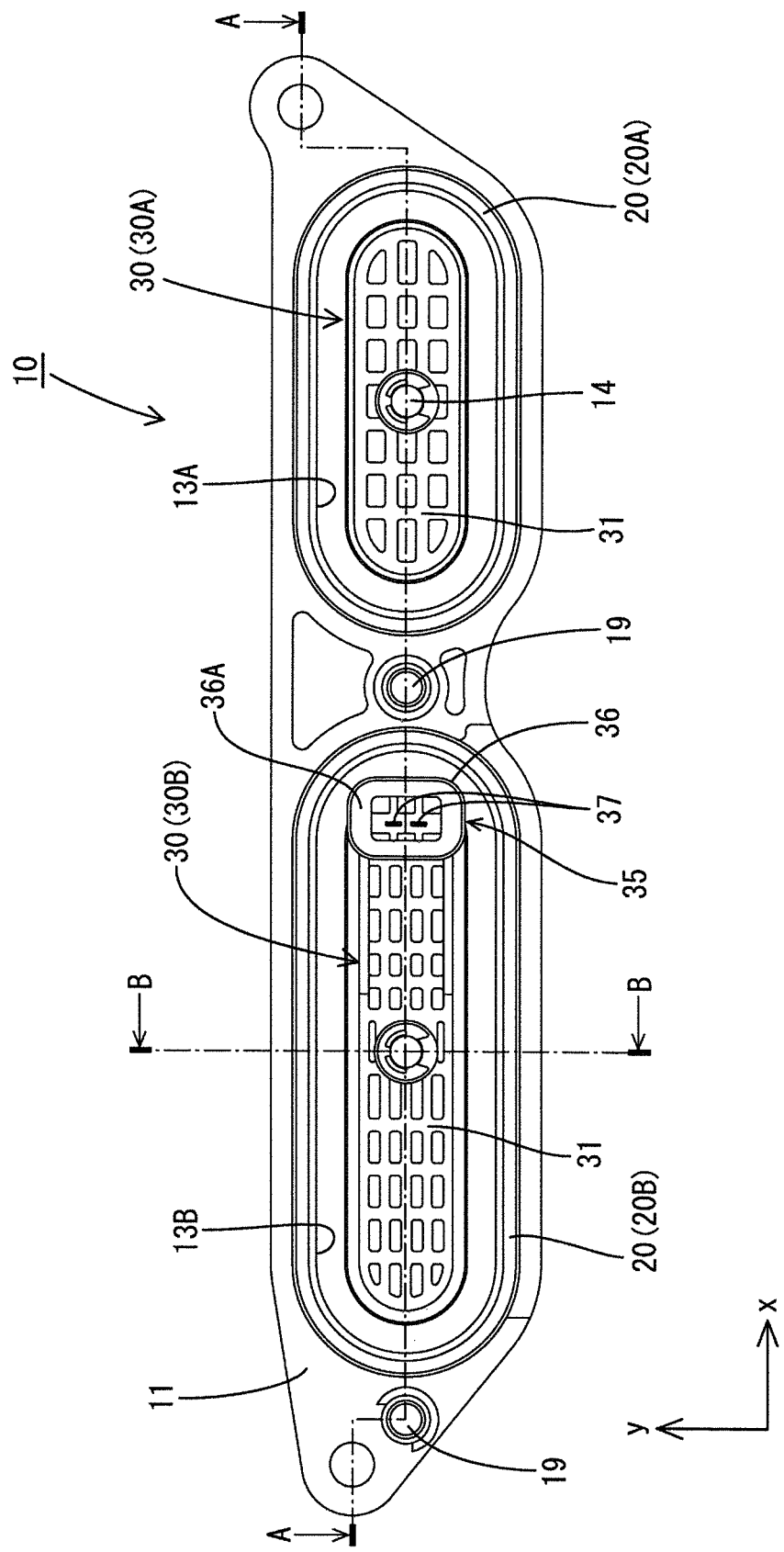
FIG. 1 is a front view of a sealing cover of electric equipment to be mounted on a car according to an embodiment of the invention.
Figure 2:
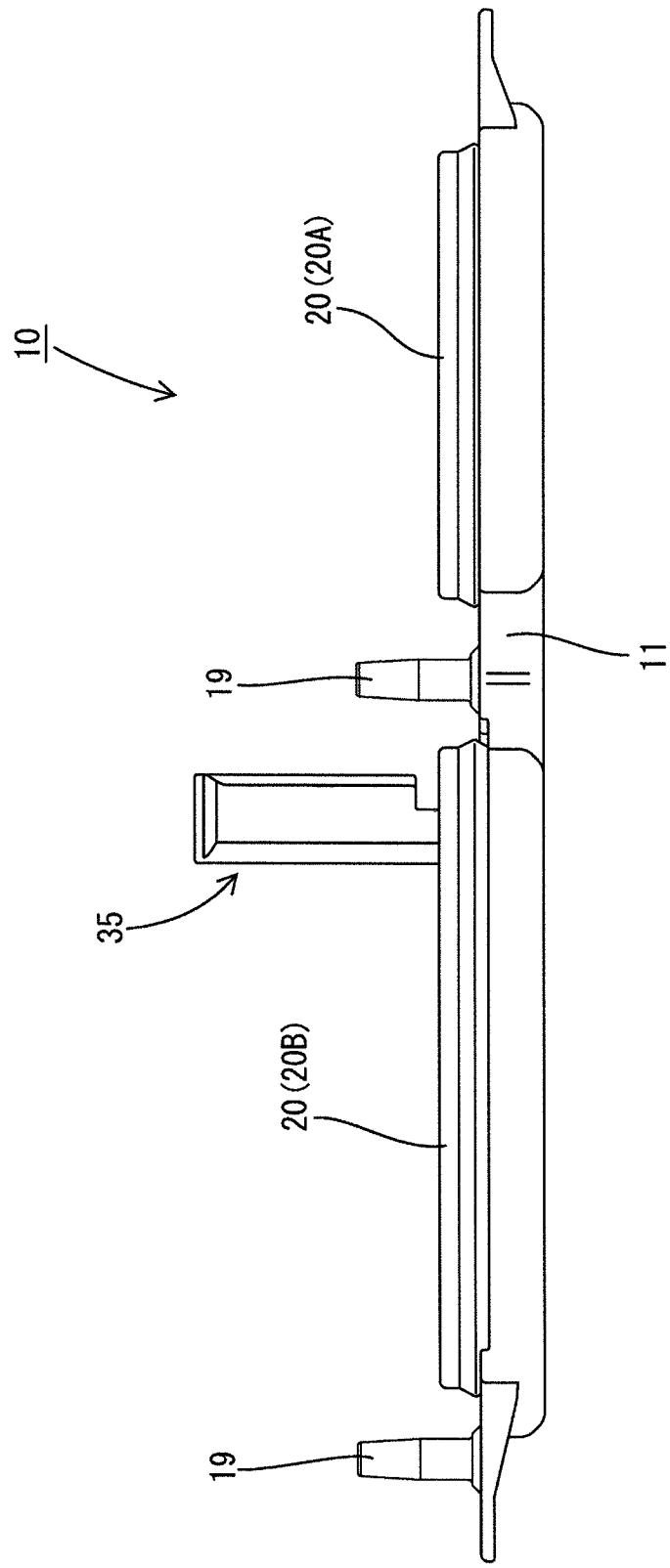
FIG. 2 is a side view of the sealing cover.
Figure 3:
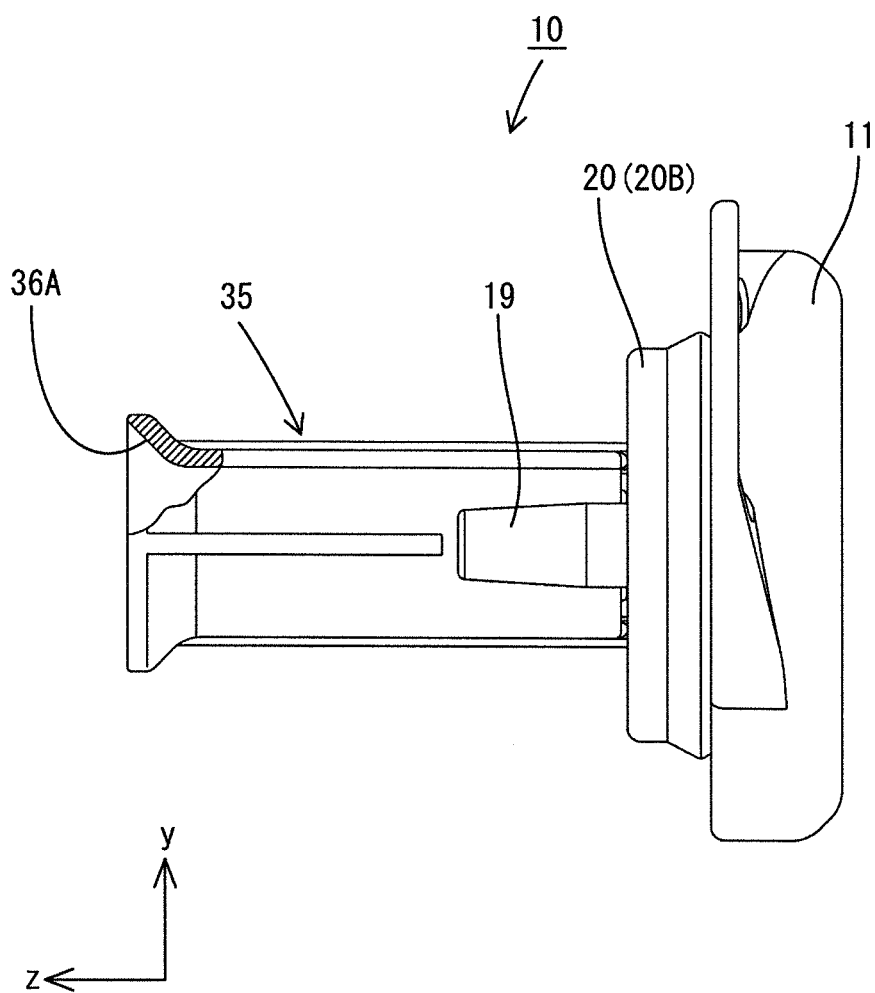
FIG. 3 is a side view showing a shorter side of the sealing cover of the electric equipment to be mounted on the car.

A sealing cover in accordance with the invention is identified by the numeral 10 in FIGS. 1 to 3 and 7 to 9. The sealing cover 10 is used to close two open parts formed on a shielding case C that accommodates electric equipment 100 of a car. An electric circuit of the electric equipment 100 has an operation control portion with an input terminal 102 that can switch a main body circuit from an operating state to a shutdown state and vice versa. As shown in FIGS. 1 through 3, the sealing cover 10 has holding plates 30A, 30B. The holding plate 30B is formed integrally with an interlocking connector 35 that is connectable with the input terminal. The sealing cover 10 also has a cover body 11 with a mounting means for mounting the cover body 11 on the open part. Sealing rings 20A, 20B are sandwiched fixedly between the cover body 11 and the holding plates 30A, 30B. The sealing cover 10 is mounted on the open part in the Z-axis direction. The longitudinal direction of the cover body 11 in FIG. 1 defines an X-axis direction, whereas the shorter direction of the cover body 11 in FIG. 1 defines a Y-axis direction.

Figure 4:
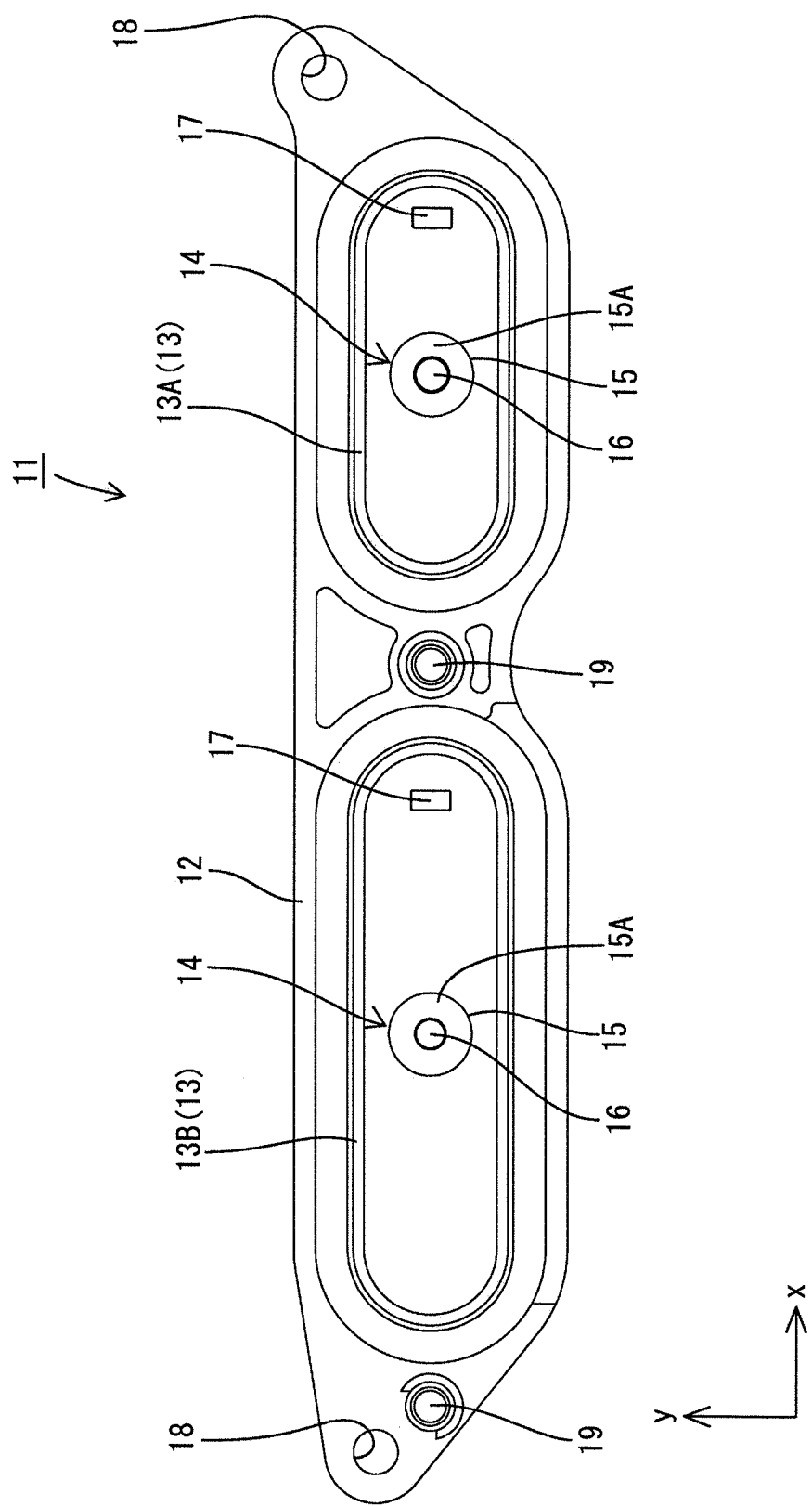
FIG. 4 is a front view of a cover body according to the invention.

The cover body 11 is made of die-casted aluminum. As shown in FIG. 4, the cover body 11 has a wide covering part 12 that covers the open part of an unshown equipment case. First and second annular sealing ring holding walls 13A, 13B project vertically in the Z-axis direction to the covering part 12. Each annular sealing ring holding wall 13A, 13B has an approximately elliptic configuration that is long in the X-axis direction with an outer configuration conforming to an inner peripheral surface of the unshown open part. The first sealing ring holding wall 13A is at the right side in FIG. 4 and the second sealing ring holding wall 13B is at the left side. The interlocking connector 35 is mounted at an inner side of the second sealing ring holding wall 13B. Holding projections 14 project from approximately central positions within the first and second sealing ring holding walls 13A, 13B for holding the respective sealing ring 20A, 20B and holding plates 30A, 30B.

Figure 7:
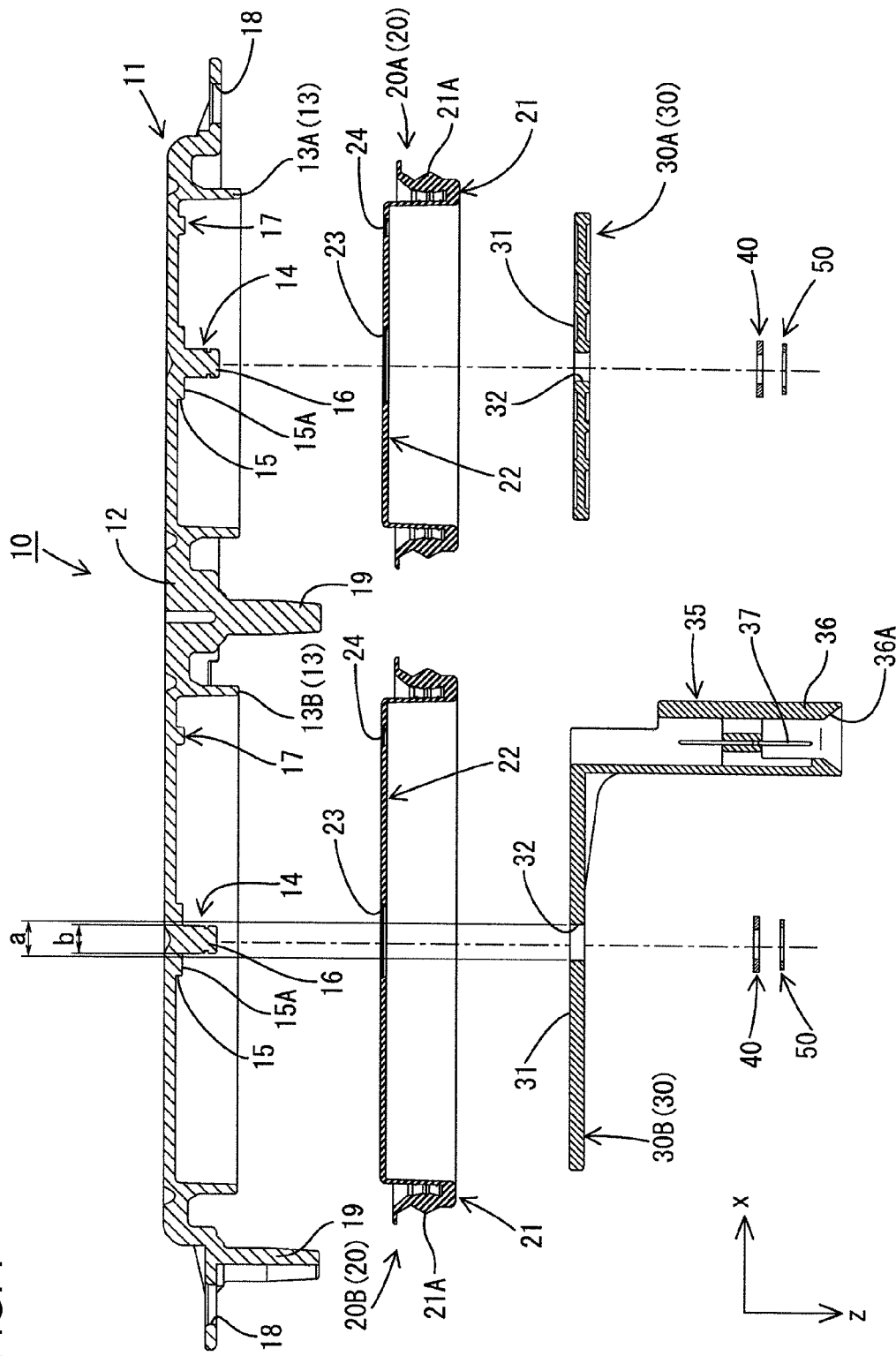
FIG. 7 is an exploded view taken along a line A-A of FIG. 1.

Each holding projection 14 has a first holding part 15 for holding the sealing ring 20A, 20B and a second holding part 16 formed stepwise and coaxially with the first holding part 15 for holding the respective holding plate 30A, 30B, as shown in FIGS. 4 and 7. The first holding part 15 is approximately columnar and projects from the covering part 12, as shown in FIG. 7. Each sealing ring 20A, 20B has a mounting hole 23 that is fixed to a side of the first holding part 15 along a projecting direction of the first holding part 15 by bringing the mounting hole 23 into close contact with the first holding part 15. The second holding part 16 projects coaxially with the first holding part 15 from an upper surface 15A of the first holding part 15. The second holding part 16 is approximately columnar and has a diameter smaller than the first holding part 15. The second holding part 16 is inserted through a holding hole 32 of the respective holding plate 30A, 30B so that the second holding part 16 is movable in an XY direction. A hold-down portion 31 of the holding plate 30A, 30B is supported by the upper surface 15A of the first holding part 15. A washer 40 and an E-ring 50 or other fixing element are fit fixedly on the holding projection 14 inserted through the mounting hole 23 of the respective sealing ring 20A, 20B and through the holding hole 32 of the corresponding holding plate 30A, 30B. Thus, the holding plates 30A, 30B are fixed in the Z-axis direction (see FIGS. 7 and 8).

In addition to the holding projection 14, a guide projection 17 projects from the inner side of the sealing ring holding wall 13, as shown in FIGS. 4 and 7, for guiding the mounting of the sealing ring 20A, 20B. A guide insertion hole 24 is formed through each sealing ring 20A, 20B for receiving the respective guide projection 17. The height of each guide projection 17 is equal to the thickness of a fixing part 22 of the respective sealing ring 20A, 20B in the Z-axis direction.

A mounting hole 18 is formed through each end of the covering part 12 in the X-axis direction, as shown in FIGS. 4 and 7. Each mounting hole 18 overlaps with a bolt insertion hole formed through the peripheral portion of the open part, and a bolt is screwed therein to fix the sealing cover 10 to the open part.

Guide pins 19 project from the covering part 12 and can be fit on a positioning portion formed on the periphery of the open part. The guide pins 19 are formed between the mounting hole 18 at the left side in FIGS. 4 and 7 and the second sealing ring holding wall 13B and between the first and second sealing ring holding walls 13A and 13B.

Figure 5:
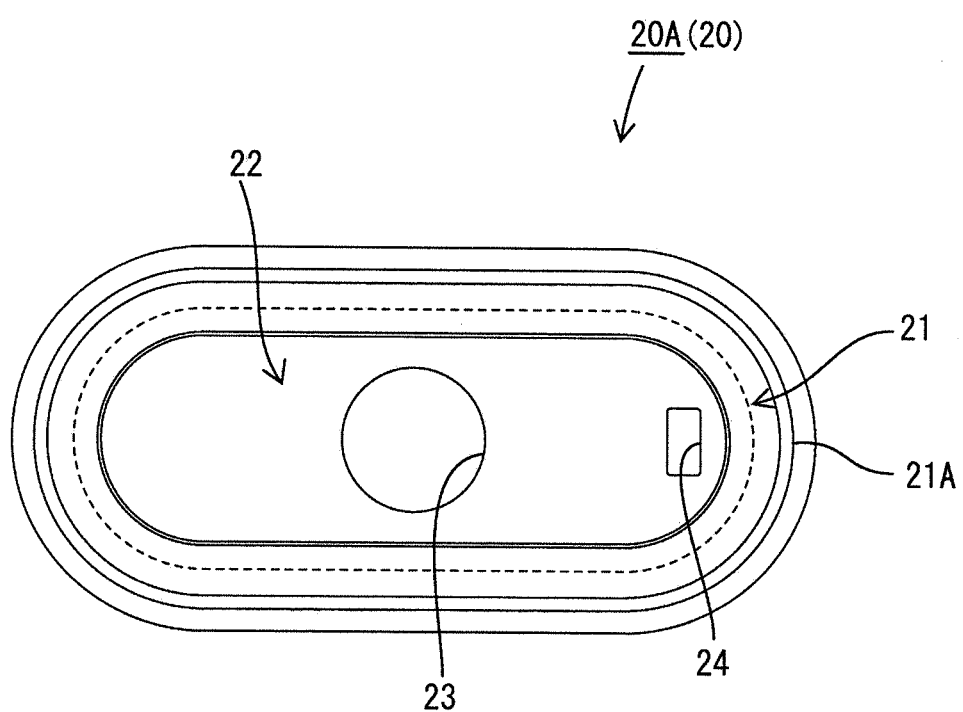
FIG. 5 is a front view of a first sealing ring according to the invention.
Figure 6:
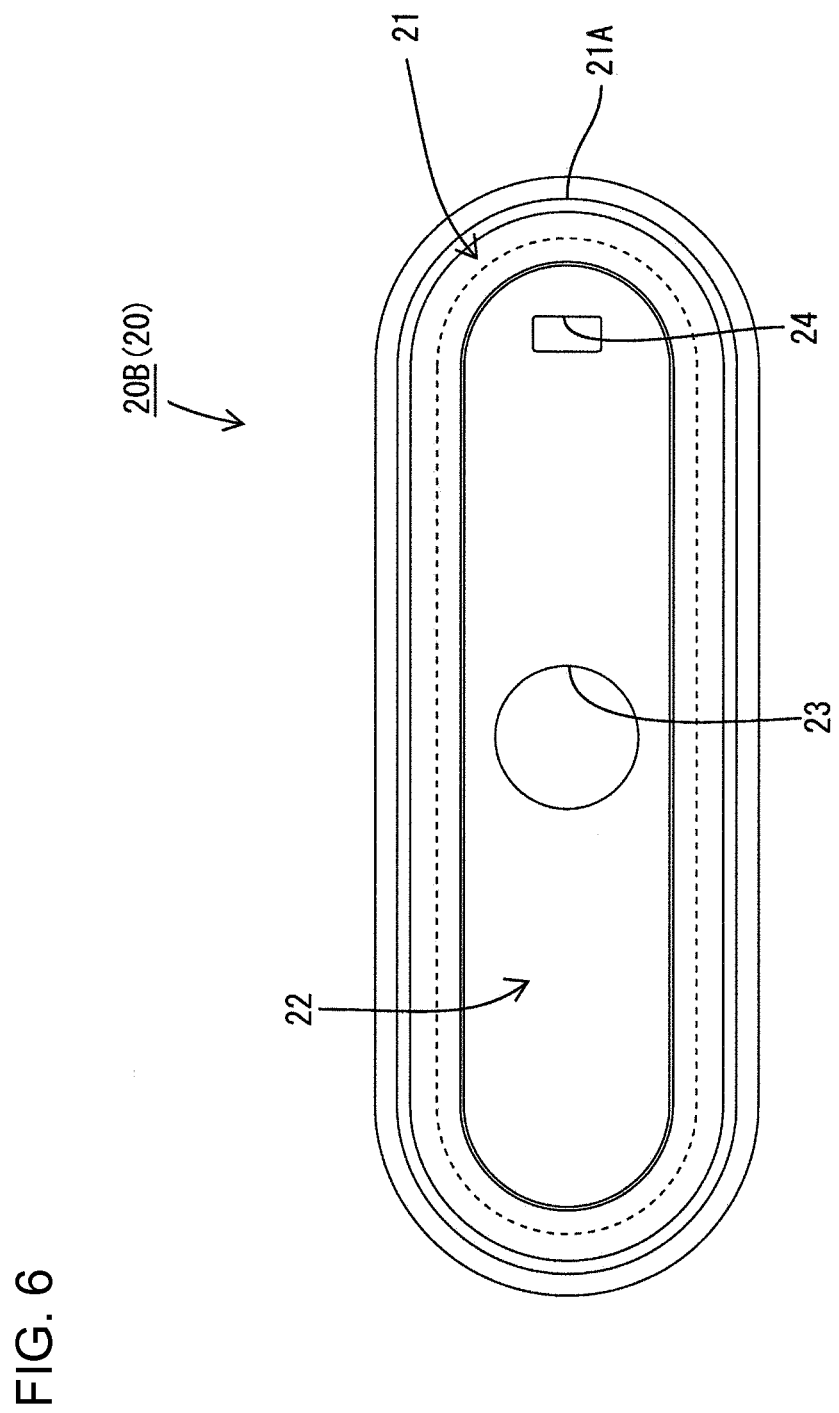
FIG. 6 is a front view of a second sealing ring according to the invention.

As shown in FIG. 7, the first sealing ring 20A is to be fit on the first sealing ring holding wall 13A and the second sealing ring 20B is to be fit on the second sealing ring holding wall 13B. As shown in FIGS. 5 and 6, each of the sealing rings 20A, 20B has an annular sealing part 21 to be mounted on the respective sealing ring holding wall 13A, 13B with the annular sealing part 21 covering the sealing ring holding wall 13A, 13B and the flat fixing part 22 extended from an inner end of the annular sealing part 21 and covering the entire inner region of the cover body 11 surrounded with the sealing ring holding wall 13 along the covering part 12. An outer side surface of the annular sealing part 21 defines a sealing surface for the unshown open part. Each sealing ring 20A, 20B has a one-fold lip 21A (see FIG. 8). The annular sealing part 21 closely contacts the inner peripheral surface of the open part to seal the gap between the open part and the sealing cover 10. Thus, water cannot penetrate into the equipment case C from the open part.

The mounting hole 23 is formed at approximately the central position of each fixing part 22, as shown in FIGS. 5 and 6, and can receive the holding projection 14 of the cover body 11. The mounting hole 23 is approximately circular and has an inner diameter almost equal to the outer diameter of the first holding part 15 of the cover body 11 (see FIG. 7). A guide insertion hole 24 is formed through the fixing part 22 of each sealing ring 20A, 20B at a position (right side of FIGS. 5 and 6) near the sealing ring holding wall 13. The guide insertion hole 24 can receive the guide projection 17 of the cover body 11.

Each holding plate 30A, 30B is made of synthetic resin and is mounted on the cover body 11 with the sealing ring 20A, 20B sandwiched between the cover body 11 and the holding plate 30A, 30B, as shown in FIG. 1. The first holding plate 30A is mounted inside the first sealing ring holding wall 13A and the second holding plate 30B is mounted inside the second sealing ring holding wall 13B.

Each holding plate 30A, 30B has a flat hold-down portion 31 with an elliptic configuration similar to the configuration of the inner periphery of the annular sealing part 21 of the sealing ring 20 at the side thereof to be mounted on the sealing ring holding wall 13. The width of the hold-down portion 31 in the X-axis and Y-axis directions is so set that the periphery of the hold-down portion 31 is slightly inward from the inner periphery of the annular sealing part 21, as shown in FIG. 1. The hold-down portion 31 is mesh-like and thin. Thus the hold-down portion 31 contributes to a decrease in the weight of the holding plate 30. As shown in FIG. 7, an approximately circular holding hole 32 is formed at approximately a central portion of the hold-down portion 31 and can receive the second holding part 16 of the cover 12. An inner diameter "a" of the holding hole 32 is set larger than an outer diameter "b" of the second holding part 16 of the cover body 11. Thus, the holding plate 30 is movable in the XY direction by the difference between the inner diameter "a" of the holding hole 32 and the outer diameter "b" of the second holding part 16.

An interlocking connector 35 is formed integrally with an end of the hold-down portion 31 of the second holding plate 30B at a position near the first sealing ring holding wall 13A and projects orthogonally to the hold-down portion 31. As shown in FIG. 7, the interlocking connector 35 has an approximately box-shaped connection part 36 that holds a short-circuit terminal 37. A guide 36A is formed at an edge of an opening of the connection part 36 at the side thereof where the input terminal 102 and the interlocking connector 35 are connected to each other (see FIGS. 1 and 7). The guide 36A inclines toward the inner side of the interlocking connector 35.

Figure 8:
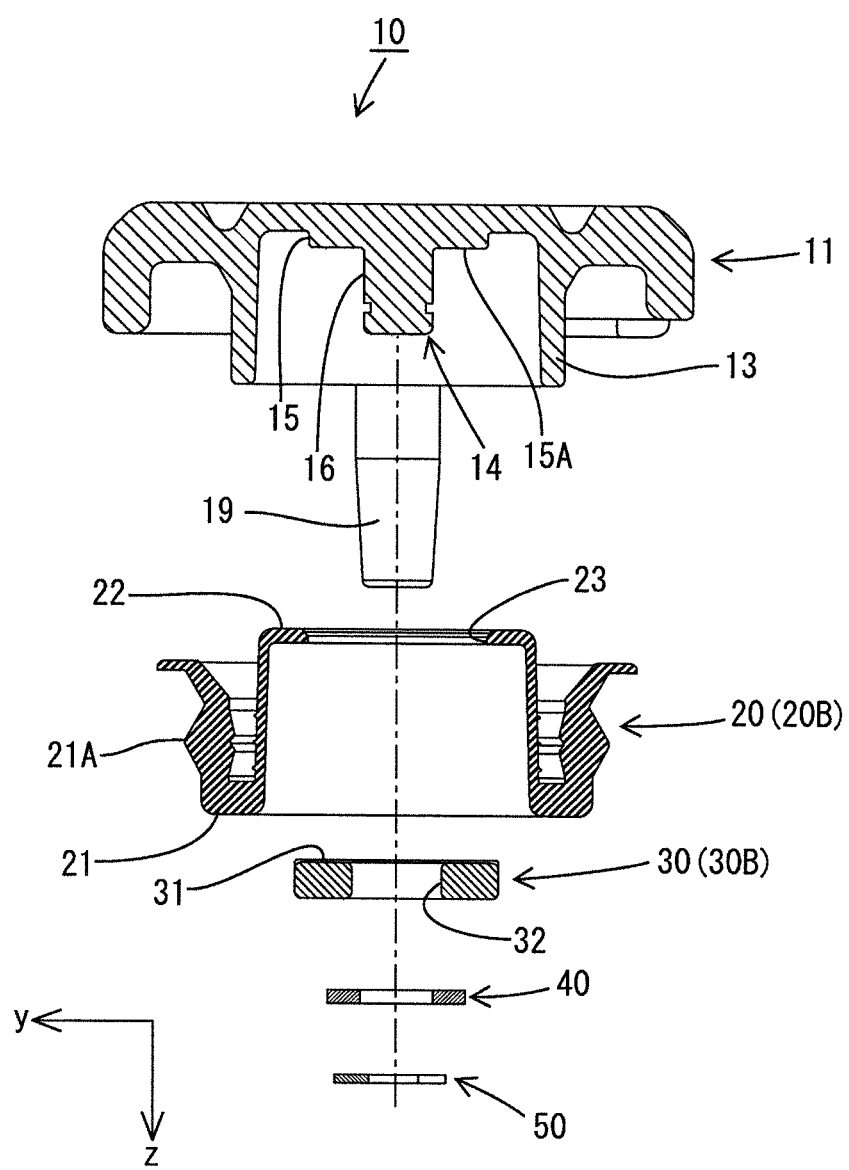
FIG. 8 is an exploded view taken along a line B-B of FIG. 1.

The procedure of assembling the sealing cover 10 is described with reference to FIGS. 7 through 10. As shown in FIGS. 7 and 8, the sealing rings 20A, 20B initially are fit in the cover body 11. Specifically, each sealing ring 20A, 20B is oriented to insert the appropriate guide projection 17 through the guide insertion hole 24 and then the annular sealing part 21 is fit on the sealing ring holding wall 13. At the same time, the holding projection 14 is inserted through the mounting hole 23 and the guide projection 17 is inserted through the guide insertion hole 24. The mounting of the sealing rings 20A, 20B on the cover body 11 is completed by fitting the first holding part 15 of the holding projection 14 in the corresponding mounting hole 23.

Figure 9:
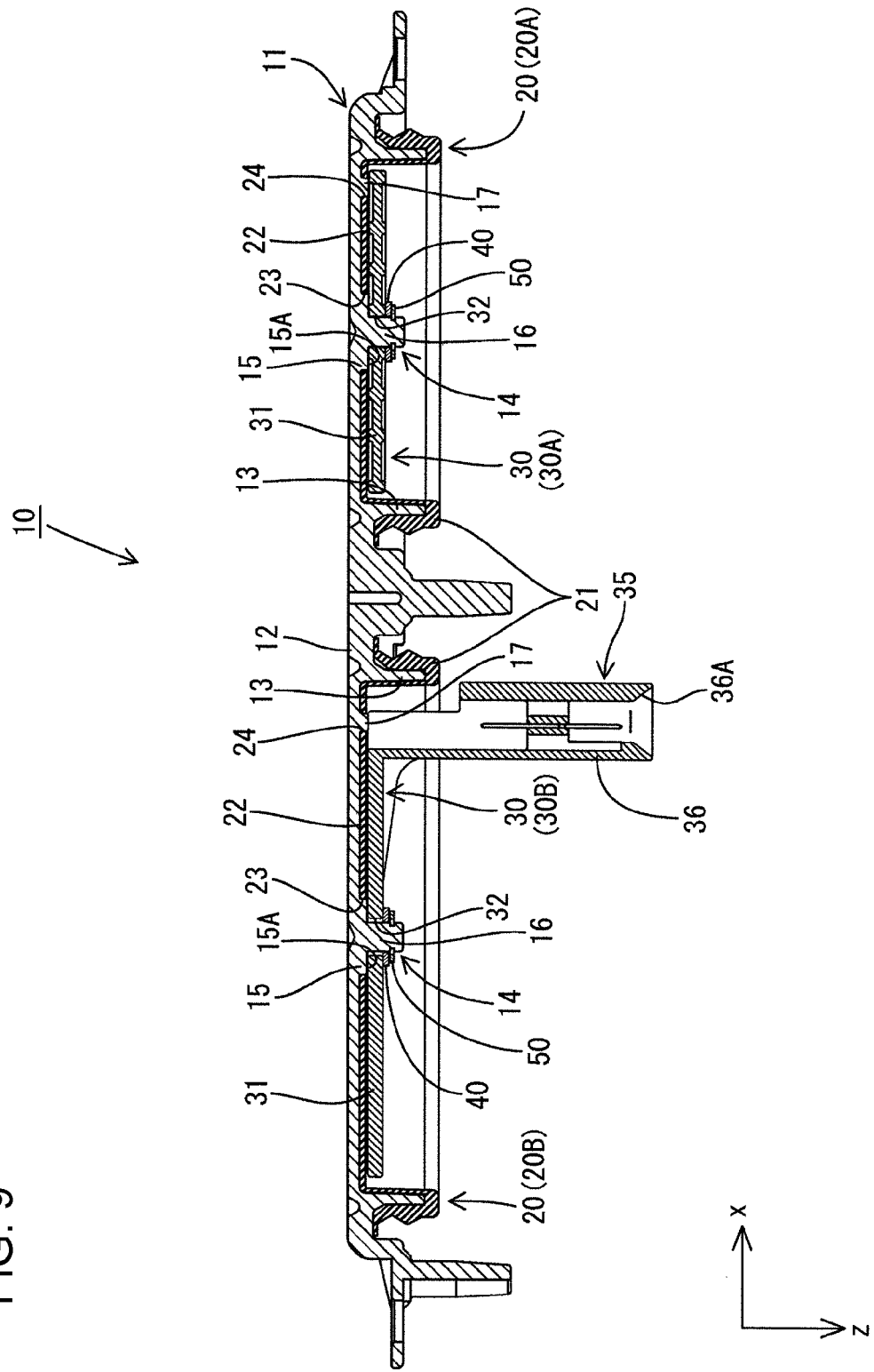
FIG. 9 is a sectional view showing a state in which the sealing cover has been assembled from a state shown in FIG. 7.
Figure 10:
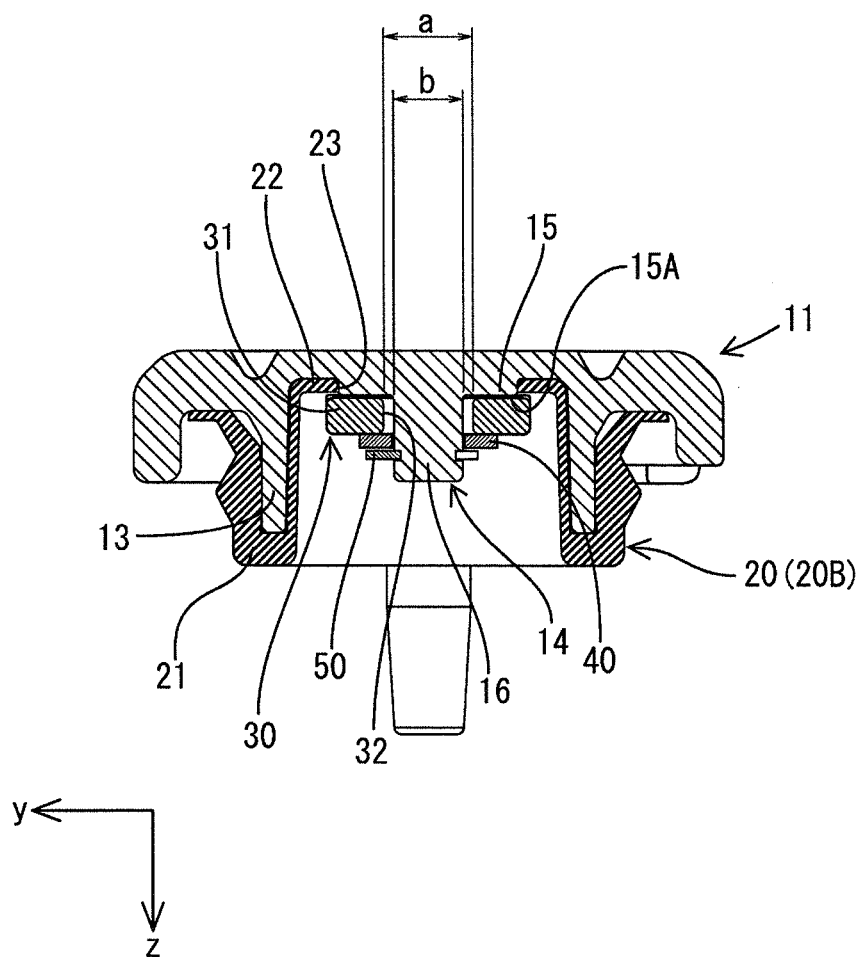
FIG. 10 is a sectional view showing a state in which the sealing cover has been assembled from a state shown in FIG. 8.

The holding plates 30A, 30B then are mounted on the cover body 11 on which the sealing rings 20A, 20B have been mounted. Specifically the second holding part 16 of the holding projection 14 is inserted through the holding hole 32 of the holding plate 30. As a result, each hold-down portion 31 is supported by the upper surface 15A of the first holding part 15 and the upper surface of the fixing part 22 of the sealing ring 20. Thereafter the washers 40 and the E-rings 50 are fit on the holding projection 14. The assembled sealing cover 10 is shown in FIGS. 9 and 10.

To mount the sealing cover 10 on the open part of the equipment case C, the orientation of the sealing cover 10 is checked to mount the guide pin 19 of the cover body 11 on the positioning portion set on the periphery of the open part. The input terminal 102 inside the equipment case C and the interlocking connector 35 then are connected to each other. The guide portion 36A at the opening of the connection part 36 of the interlocking connector 35 easily guides the input terminal 102 into electrical connection with the interlocking connector 35. Thereafter the guide pin 19 is mounted on the unshown positioning portion in a state where the interlocking connector 35 has been fit temporarily on the input terminal 102. At this time, the holding plate 30 having the interlocking connector 35 is movable in XY directions relative to the cover body 11 in a range defined by the difference between the inner diameter "a" of the holding hole 32 and the outer diameter "b" of the second holding part 16. Thus, the sealing cover 10 can be mounted on the equipment case by making a fine adjustment of the holding plate 30 in the XY direction so that the guide pin 19 is inserted into the positioning portion while maintaining the state where the interlocking connector 35 has been fit temporarily on the input terminal 102.

The guide pin 19 is mounted on the positioning portion, and the annular sealing part 21 of the sealing ring 20 closely contacts the inner peripheral surface of the open part to seal the gap between the sealing cover 10 and the open part. Thus, water cannot penetrate into the equipment case from the open part. The mounting hole 18 overlaps the bolt insertion hole formed on the peripheral edge of the open part. Thus, a bolt can fix the sealing cover 10 to the open part. The interlocking connector 35 is connected to the input terminal so that the unshown operation control portion switches the main body circuit from the shutdown state to the operating state.

According to the above-described construction, the interlocking connector 35 is formed integrally with the sealing cover 10 and connects with the input terminal of the equipment when the sealing cover 10 is mounted on the open part of the equipment case C. Conversely, the interlocking connector 35 is disconnected from the input terminal 102 at the operation control portion of the electric circuit of the equipment in the case simultaneously with the removal of the sealing cover 10 from the open part. Thus, the electric circuit of the equipment 100 is placed safely in the unenergized shutdown state when the open part is in an open condition that could permit contact by an operator or external foreign matter, the equipment inside the case C is placed in the unenergized state without fail. Therefore. The sealing cover 10 ensures that the operator will not receive an electrical shock.

The sealing ring 20 is held between the cover body 11 and the holding plate 30. This construction securely prevents the sealing ring 20 from being removed from the cover body 11 unlike a construction in which the sealing ring 20 is held by only a fixing means such as a groove formed on the sealing ring holding wall 13 of the cover body 11.

The geometric tolerance between the input terminal and the open part and the geometric tolerance between the interlocking connector of the sealing cover and the sealing ring must be set strictly if the cover body 11 and the interlocking connector 35 are formed integrally. If the above-described tolerances are not strict, a deviation may be generated between the cover body 11 of the sealing cover 10 having the interlocking connector 35 and the open part, after the interlocking connector 35 and the input terminal 102 inside the equipment case C are connected to each other. Thus, a situation may occur in which the sealing cover 10 cannot be mounted on the sealing cover 10. However, the interlocking connector 35 of the subject invention is formed integrally with the sealing cover 10.

According to the invention, the holding plate 30 is mounted on the cover body 11 in such a way that the holding plate 30 is movable relative to the cover body 11 in a predetermined range and in a direction orthogonal to the direction in which the cover body 11 is mounted on the open part of the equipment case. Therefore it is possible to absorb the geometrical tolerance between the interlocking connector 35 formed integrally with the holding plate 30 and the sealing ring 20. As shown in FIG. 10, the movable range of the holding plate 30 in the XY direction relative to the cover body 11 is determined by the difference between the inner diameter "a" of the holding hole 32 of the holding plate 30 and the outer diameter "b" of the second holding part 16 of the holding projection 14 of the cover body 11. Strict geometrical tolerance between the cover body 11 having the sealing ring 20 and the holding plate 30 having the interlocking connector 35 is unnecessary. Thus, quality management for the geometrical tolerance between members is easier and the rate of defective sealing covers is decreased. Consequently, production cost is reduced.

The invention is not limited to the embodiments described above with reference to the drawings. For example, the following embodiments are also included in the technical scope of the present invention.

Two guide pins 19 are on the cover body 11 in the illustrated embodiment. However, the guide pins 19 may be omitted if the mounting direction of the cover body 11 is made definite by the configuration of the covering part 12. Thus, the configuration of the cover body 11 can be simplified and molding efficiency can be enhanced.

One sealing cover simultaneously closes two open parts arranged side by side in the illustrated embodiment. However, the number of the open parts on which the sealing cover is to be mounted may be one or three. The sealing covers may be arranged side by side in the direction of the shorter sides of the open parts. It is necessary to strictly set the geometrical tolerance between the sealing ring holding wall 13 of the cover body 11 and the open part with an increase of the number of the open parts on which the sealing covers are to be mounted respectively.

What is claimed is:

1. A sealing cover removably mounted to an open part of an equipment case accommodating an electric circuit, the electric circuit having an operation control portion for switching a main body circuit between an operating state and a shutdown state in dependence on signals inputted to an input terminal thereof, said sealing cover comprising:
    a cover body mountable on the equipment case and having a continuous covering part configured to close the open part of the equipment case, a sealing ring holding wall projecting from the covering part and having an outer peripheral surface configured to be disposed along an inner surface of the open part of the equipment case and an inner peripheral surface opposite the outer peripheral surface;
    a sealing ring having an annular sealing part fit on the inner and outer peripheral surfaces of the sealing ring holding wall and configured for sealing a gap between the cover body and an inner peripheral surface of the open part, the sealing ring further including a fixing part covering the covering part inward of the sealing ring holding wall; and
    a holding plate mounted to the cover body and holding the sealing ring on the cover body, an interlocking connector projecting from the holding plate and having a short circuit terminal therein, the short circuit terminal being disposed to be connected to the input terminal when the cover body is mounted on the equipment case and removed from the input terminal when the cover body is disconnected from the equipment case to switch the main body circuit from the operating state to the shutdown state.

2. The sealing cover of claim 1, wherein the interlocking connector has a connection part integral with the holding plate, the short circuit terminal being mounted in the connection part.

3. The sealing cover of claim 2, wherein the holding plate is dimensioned for movement on the cover body in a direction orthogonal to a direction in which the cover body is mounted on the equipment case.

4. The sealing cover of claim 2, wherein the connection part of the interlocking connector has an inclined entry leading to the short circuit terminal.

5. The sealing cover of claim 1, wherein the cover body has a to-be-positioned portion which fits a positioning portion formed on a periphery of the open part for positioning the cover body relative to the equipment case.

6. A sealing cover, comprising:
    a cover body having a continuous covering wall and an annular sealing ring holding wall projecting from the covering wall, the annular sealing ring holding wall having opposite inner and outer peripheral surfaces;
    a sealing ring mounted on the cover body, the sealing ring having an annular sealing part fit on the inner and outer peripheral surfaces of the sealing ring holding wall and a fixing part covering the covering wall inward of the sealing ring holding wall; and
    a holding plate mounted to the cover body so that the fixing part of the sealing ring is held between the holding plate and the cover body, an interlocking electrical connector projecting from the holding plate in a projecting direction and having a short circuit terminal mounted therein, the holding plate being dimensioned for movement on the cover body in directions perpendicular to the projecting direction of the interlocking electrical connector to facilitate alignment of the interlocking electrical connector.

7. The sealing cover of claim 6, wherein the annular sealing ring holding wall projects substantially parallel to the projecting direction of the interlocking electrical connector.

8. The sealing cover of claim 7, wherein the annular sealing part is disposed on inner and outer peripheral surfaces of the sealing ring holding wall.

9. The sealing cover of claim 7, wherein the cover body has a holding projection projecting in the projecting direction of the interlocking electrical connector, the fixing part of the sealing ring having a mounting hole and the holding plate having a holding hole, the holding projection of the cover body being inserted through the mounting hole of the fixing part of the sealing ring and through the holding hole of the holding plate.

10. The sealing cover of claim 9, wherein the holding hole of the holding plate is sufficiently larger than the holding projection to permit the holding plate to move on the cover body in the directions perpendicular to the projecting direction of the interlocking electrical connector.

11. The sealing cover of claim 10, further comprising a fixing element mounted to the holding projection and holding the holding plate in a fixed position on the holding projection relative to the projecting direction of the interlocking electrical connector.

12. A sealing cover, comprising:

a cover body having a continuous covering wall and first and second annular holding walls projecting from the covering wall in a projecting direction, each of the annular holding walls having opposite inner and outer peripheral surfaces;

first and second sealing rings formed respectively with first and second annular sealing parts engaging the inner and outer peripheral surfaces of the respective first and second annular holding walls and first and second fixing parts contacting the covering wall of the cover body inward of the respective sealing ring holding wall; and first and second holding plates mounted to the cover body so that the fixing parts of the respective seal rings are held between the respective holding plates and the cover body, an interlocking electrical connector projecting from the first holding plate in the projecting direction and having a conductive terminal mounted therein, the holding plates being dimensioned for movement on the cover body in directions perpendicular to the projecting direction to facilitate alignment of the interlocking electrical connector relative to the annular holding walls.

13. The sealing cover of claim 12, wherein the cover body has first and second holding projections projecting in the projecting direction of the interlocking electrical connector at positions surrounded by the respective annular holding walls, the fixing part of each of the sealing rings having a mounting hole and each of the holding plates having a holding hole, the holding projections of the cover body (11) being inserted through the mounting hole of the fixing part of the respective sealing ring and through the holding hole of the respective holding plate.

14. The sealing cover of claim 13, wherein the holding hole of each of the holding plates is sufficiently larger than the respective holding projection to permit the holding plates to move on the cover body (11) in the directions perpendicular to the projecting direction.

15. The sealing cover of claim 14, further comprising fixing elements mounted respectively to the holding projections and holding the holding plates in fixed positions on the respective holding projections relative to the projecting direction.

\* \* \* \* \*